United States Patent
Connell et al.

(10) Patent No.: US 10,693,470 B2
(45) Date of Patent: Jun. 23, 2020

(54) DUAL MODE POWER SUPPLY FOR VOLTAGE CONTROLLED OSCILLATORS

(71) Applicant: Futurewei Technologies, Inc., Plano, TX (US)

(72) Inventors: Lawrence E Connell, Naperville, IL (US); Michael Bushman, Manitowoc, WI (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 16/049,601

(22) Filed: Jul. 30, 2018

(65) Prior Publication Data

US 2020/0036383 A1    Jan. 30, 2020

(51) Int. Cl.
| | | |
|---|---|---|
| H03L 5/02 | (2006.01) |
| H03B 5/04 | (2006.01) |
| H03B 5/06 | (2006.01) |
| H03L 7/093 | (2006.01) |
| H03G 3/30 | (2006.01) |
| H03L 7/099 | (2006.01) |
| H03L 7/08 | (2006.01) |

(52) U.S. Cl.
CPC ............... *H03L 5/02* (2013.01); *H03B 5/04* (2013.01); *H03B 5/06* (2013.01); *H03G 3/3036* (2013.01); *H03L 7/0802* (2013.01); *H03L 7/093* (2013.01); *H03L 7/099* (2013.01)

(58) Field of Classification Search
CPC . H03L 5/00; H03L 5/02; H03L 7/0802; H03L 7/093; H03B 5/04; H03B 5/06
USPC .................................................. 331/182, 183
See application file for complete search history.

(56) References Cited

U.S. PATENT DOCUMENTS

| | | | |
|---|---|---|---|
| 6,052,036 A | 4/2000 | Enstrom et al. |
| 6,278,338 B1 | 8/2001 | Jansson |
| 6,909,336 B1 | 6/2005 | Rajagopalan et al. |
| 7,123,113 B1 * | 10/2006 | Brennan .................. H03L 5/00 331/158 |

(Continued)

FOREIGN PATENT DOCUMENTS

CN        106059577 A        10/2016

OTHER PUBLICATIONS

U.S. Appl. No. 16/049,612, filed Jul. 30, 2018 by Bushman.

(Continued)

*Primary Examiner* — Levi Gannon
(74) *Attorney, Agent, or Firm* — Vierra Magen Marcus LLP

(57) ABSTRACT

The disclosure relates to technology for power supply for a voltage controller oscillator (VCO), where the power supply has a closed loop mode and an open loop mode. In closed loop mode, a peak detector circuit determines the amplitude of the output for the VCO, which is compared to a reference value in an automatic gain control loop. An input voltage for the VCO is determined based on a difference between the reference value and the output of the peak detector circuit. The peak detector circuit can be implemented using parasitic bipolar devices in an integrated circuit formed in a CMOS process. While operating in the closed loop mode, a controller monitors the input voltage and, when the input voltage is stabilized, the controller uses this input voltage value determined in open loop mode.

19 Claims, 9 Drawing Sheets

(56) References Cited

U.S. PATENT DOCUMENTS

| | | | |
|---|---|---|---|
| 7,324,561 B1* | 1/2008 | Miller | H03K 5/08 |
| | | | 331/182 |
| 7,332,979 B2 | 2/2008 | Connell et al. | |
| 7,728,677 B2 | 6/2010 | Logan | |
| 7,911,284 B2* | 3/2011 | Kuwano | H03B 5/1228 |
| | | | 331/1 R |
| 8,816,786 B2* | 8/2014 | Tham | H03L 5/00 |
| | | | 331/109 |
| 9,054,637 B1* | 6/2015 | Mittal | H03B 5/364 |
| 10,389,364 B2* | 8/2019 | Viegas | H03L 5/00 |
| 2002/0171499 A1 | 11/2002 | Momtaz et al. | |
| 2006/0158271 A1 | 7/2006 | Juang et al. | |
| 2007/0063781 A1* | 3/2007 | Huynh | H03L 5/00 |
| | | | 331/182 |
| 2008/0018410 A1 | 1/2008 | Kawai | |
| 2014/0035684 A1* | 2/2014 | Na | H03L 5/00 |
| | | | 331/15 |
| 2015/0180410 A1* | 6/2015 | Yamamoto | H03B 5/04 |
| | | | 331/70 |
| 2015/0236707 A1 | 8/2015 | Tokairin et al. | |
| 2017/0294915 A1* | 10/2017 | Huang | H03L 5/00 |
| 2019/0007012 A1* | 1/2019 | Marques | H03B 5/06 |

OTHER PUBLICATIONS

Restriction Requirement dated Sep. 9, 2019, U.S. Appl. No. 16/049,601, filed Jul. 30, 2018.

Response to Restriction Requirement dated Oct. 10, 2019, U.S. Appl. No. 16/049,601, filed Jul. 30, 2018.

Response to Office Action dated Feb. 3, 2020, U.S. Appl. No. 16/049,612, filed Jul. 30, 2018.

International Search Report & The Written Opinion of the International Searching Authority dated Nov. 6, 2019, International Application No. PCT/CN2019/098290.

Non-final Office Action dated Nov. 4, 2019, U.S. Appl. No. 16/049,612, filed Jul. 30, 2018.

* cited by examiner

DUAL MODE POWER SUPPLY FOR VOLTAGE CONTROLLED OSCILLATORS

FIELD

The disclosure generally relates to power supplies for voltage controller oscillators (VCOs) and methods for use therewith.

BACKGROUND

Voltage Controlled Oscillators (VCOs) are an integral part of the frequency reference circuitry in transmitters and receivers producing the carrier waves which are modulated by the information being conveyed in telecommunications equipment. In prior art, the power supplies for the VCOs would be voltage or current sources. As tolerances for electrical components of an integrated circuit process increase, the variation in the performance of a VCO increases, often causing it to miss critical performance specifications when mass produced. To mitigate the variation, the VCO's power supply is sometimes made programmable so that it can be adjusted as the frequency of the VCO is changed or its operating temperature changes. In some prior art, a duplicate circuit of the VCO's active components is used in an attempt to mirror the behavior of the VCO, so that the VCO's power supply can be adjusted based on the variation of those active devices. The limitations of these approaches are that they cannot mirror the actual performance of the VCO since the VCO is oscillating. An oscillating circuit has characteristics associated with the quality, or Q, factor of its resonator that vary with tolerances, and which are not reflected by simple active devices or programmable sources. Creating a duplicate oscillating circuit to mirror the behavior of the VCO would create a frequency that would interfere with the frequency of the VCO itself, causing spurs. Therefore, these prior art approaches will not fully compensate for the variation in the VCO due to tolerances.

BRIEF SUMMARY

According to one aspect of the present disclosure, there is provided an oscillator system including a voltage controller oscillator (VCO), a reference generator, an automatic gain control loop, and a controller. The VCO is configured to generate an output waveform having an amplitude based on an input voltage. The reference generator is configured to provide a reference value. The automatic gain control loop is configured to receive the output waveform, determine an indication of the amplitude of the output waveform, and generate a difference between the reference value and the indication of the amplitude of the output waveform. The controller is configured to operate the oscillator system in both a first mode and a second mode. When operating in the oscillator system in the first mode, the controller configures the automatic gain control loop to provide the input voltage based on the difference and is configured to determine a second mode input voltage value based on monitoring the provided input voltage. When operating in the oscillator system in the second mode, the controller is configured to provide the second mode input voltage value as the input voltage.

Optionally, in any of the preceding aspects, the controller is further configured to operate the oscillator system in the second mode upon a subsequent start up.

Optionally, in any of the preceding aspects, subsequent to operating the oscillator system in the second mode, the controller is configured operate the oscillator system in the first mode to update the second mode input voltage value.

Optionally, in any of the preceding aspects, when operating the oscillator system in the second mode, the controller is further configured to adjust the input voltage based on operating conditions.

Optionally, in any of the preceding aspects, the automatic gain control loop includes a peak detector, an analog circuit, and an amplifier. The peak detector is configured to receive the output waveform generated by the VCO and determine the indication of the amplitude of the output waveform. The analog circuit is configured to receive the reference value and the indication of the amplitude of the output waveform and determine the difference between the reference value and the indication of the amplitude of the output waveform. The amplifier is configured to generate the input voltage based on the difference.

Optionally, in any of the preceding aspects, the automatic gain control loop can also include a source follower circuit and a low pass filter. The source follower circuit is connected between the amplifier and the VCO and is configured to supply the input voltage to the VCO. The low pass filter is connected between the amplifier and the source follower circuit and configured to filter the input voltage generated by the amplifier before the input voltage is supplied to the source follower circuit.

Optionally, in any of the preceding aspects, the automatic gain control loop includes a peak detector, an analog to digital converter, and a digital to analog converter The peak detector is configured to receive the output waveform generated by the VCO and determine an indication of the amplitude of the output waveform. The analog to digital converter is configured to receive the indication of the amplitude of the output waveform and provide a digital representation thereof, where the controller is configured to receive the reference value and the digital representation of the indication of the amplitude of the output waveform and determine a digital value for the difference. The digital to analog converter is configured to receive the digital value for the difference and generate therefrom the input voltage.

Optionally, in any of the preceding aspects, the automatic gain control loop further includes a source follower circuit and a low pass filter. The source follower circuit is connected between the digital to analog converter circuit and the VCO, and is configured to supply the input voltage to the VCO. The low pass filter is connected between the digital to analog converter and the source follower circuit and is configured to filter the input voltage received from the digital to analog converter before the input voltage is supplied to the source follower circuit.

Optionally, in any of the preceding aspects, the reference generator and automatic gain control loop are formed on an integrated circuit fabricated using CMOS technology. A plurality of parasitic bipolar junction transistors are formed in the integrated circuit fabricated using CMOS technology. The automatic gain control loop includes a peak detector configured to receive the output waveform and determine an indication of the amplitude of the output waveform. The peak detector is implemented using at least some of the plurality of parasitic bipolar junction transistors.

According to one other aspect of the present disclosure, a method is presented of controlling an amplitude of an output waveform of a voltage controlled oscillator (VCO). The method includes generating an output waveform by a VCO, the output waveform having an amplitude dependent on an input voltage and generating the input voltage by a closed loop having automatic gain control. Generating the input voltage by the closed loop includes: receiving a reference level; determining a difference between an indication of the amplitude of the output waveform and the reference level; and generating the input voltage from the difference. While generating the input voltage by the closed loop, the input voltage is monitored to determine a closed loop input voltage value, and the closed loop input voltage value is subsequently supplied as the input voltage.

Optionally, in any of the preceding aspects, the method further comprises: subsequent to supplying the closed loop input voltage value as the input voltage, shutting down operation of the VCO; and subsequently restarting the VCO to generate the output waveform, and supplying the closed loop input voltage value as the input voltage.

Optionally, in any of the preceding aspects, the method also includes: subsequently updating the closed loop input voltage value, wherein updating the closed loop input voltage value comprises: generating the input voltage by the closed loop, and while generating the input voltage by the closed loop, monitoring the input voltage to determine an updated closed loop input voltage value. The updated closed loop input voltage value is subsequently supplied as the input voltage.

Optionally, in any of the preceding aspects, the method further includes, while supplying the closed loop input voltage value as the input voltage, adjusting the input voltage based on operating conditions.

Optionally, in any of the preceding aspects, the difference is an analog voltage level and generating the input voltage from the difference includes amplifying the analog voltage level.

Optionally, in any of the preceding aspects, the difference is a digital value and generating the input voltage from the difference includes converting the digital value to an analog voltage level.

According to still another aspect of the present disclosure, there is provided a power supply for a voltage controlled oscillator (VCO), including a reference generator configured to provide a reference value and a control loop. The control loop comprises: a peak detector configured to receive an output waveform of the VCO and determine an indication of an amplitude output waveform of the VCO; and an automatic gain control circuit configured to receive the reference value and the indication of the amplitude of the output waveform and generate an input voltage for the VCO based on a difference between the reference value and the indication of the output waveform. A controller is configured to operate the power supply in a first mode and in a second mode: the controller, when operating the power supply in the first mode, configures the control loop to provide the input voltage based on the difference between the reference value and the indication of the output waveform and is configured to monitor the input voltage to determine a second mode input voltage value; and the controller, when operating in the second mode, is configured to provide the second mode input voltage value as the input voltage.

Optionally, in any of the preceding aspects, the control loop is formed on an integrated circuit fabricated using CMOS technology, and a plurality of parasitic bipolar junction transistors are formed in the integrated circuit fabricated using CMOS technology. The peak detector is implemented using at least some of the plurality of parasitic bipolar junction transistors.

Optionally, in any of the preceding aspect, the automatic gain control circuit includes an analog circuit and an amplifier. The analog circuit is configured to receive the reference value and the indication of the amplitude of the output waveform and determine the difference between the reference value and the indication of the amplitude of the output waveform. The amplifier is configured to generate the input voltage based on the difference when operating the power supply in the first mode.

Optionally, in any of the preceding aspects, the automatic gain control circuit includes an analog to digital converter and a digital to analog converter. The analog to digital converter is configured to receive the indication of the amplitude of the output waveform and provide a digital representation thereof, wherein the controller is configured to receive the reference value and the digital representation of the indication of the amplitude of the output waveform and determine a digital value for the difference. The digital to analog converter is configured to receive the digital value for the difference and generate therefrom the input voltage.

Optionally, in any of the preceding aspects, the automatic gain control circuit can include a source follower circuit connected to supply the input voltage to the VCO; and a low pass filter configured to filter the input voltage before the input voltage is supplied to the source follower circuit.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

DETAILED DESCRIPTION

Figure 1:
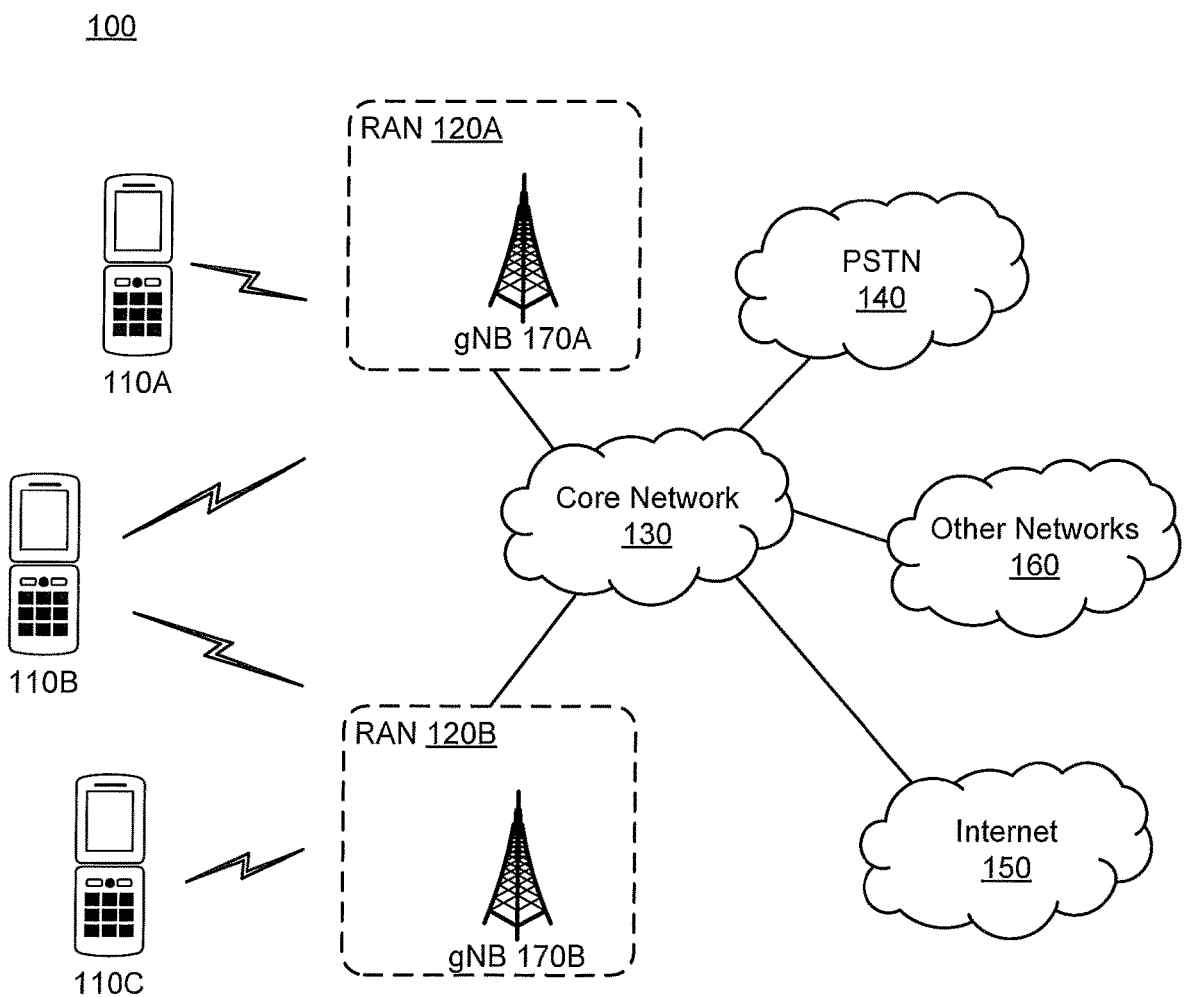
FIG. 1 illustrates an example of a wireless network for communicating data.

The present disclosure will now be described with reference to the figures, which in general relate to power supply circuits for use with a voltage controller oscillator (VCO) and methods for use therewith. The input voltage for a VCO is generated by a closed loop automatic gain control (AGC) loop, which monitors the peak amplitude of the VCO's output waveform, compares this to a reference value, and adjusts the input voltage accordingly. The VCO can be used to provide the local oscillator frequency for up-conversion and/or down-conversion in transmitters and receivers that can be used within wireless networks, an example of which is described below with reference to FIG. 1, as well as being incorporated into other devices. Although discussed below primarily in the context of providing a local oscillator frequency for a receiver or transmitter, the techniques presented in the following descriptions can be used in any application were a VCO is used, such as telecommunications equipment, cable system satellite receivers, any phase locked loop (PLL) based frequency synthesizers, and so on.

As integrated circuit (IC) technology shrinks, the process tolerances of the electrical components used in circuit design of VCOs increase. When the supply voltage for the VCOs used on these IC devices is at a fixed value, the performance characteristics of the VCOs can vary greatly due to part to part tolerance. The following disclosure presents a power supply which can adjust the operation of a VCO with wide tolerances in such a way as to allow it to meet its specifications. The power supply is low noise, so as not to impact the noise of the VCO and has a very fast start-up capability and be very stable is a short period of time. In a first closed loop mode, the presented AGC loop is used to accomplish these objectives using a peak detector structure, but without having an error integrator. An open loop digital mode senses the result of the closed loop mode and can be used to provide an extremely stable equivalent supply to mitigate frequency drift.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 2:
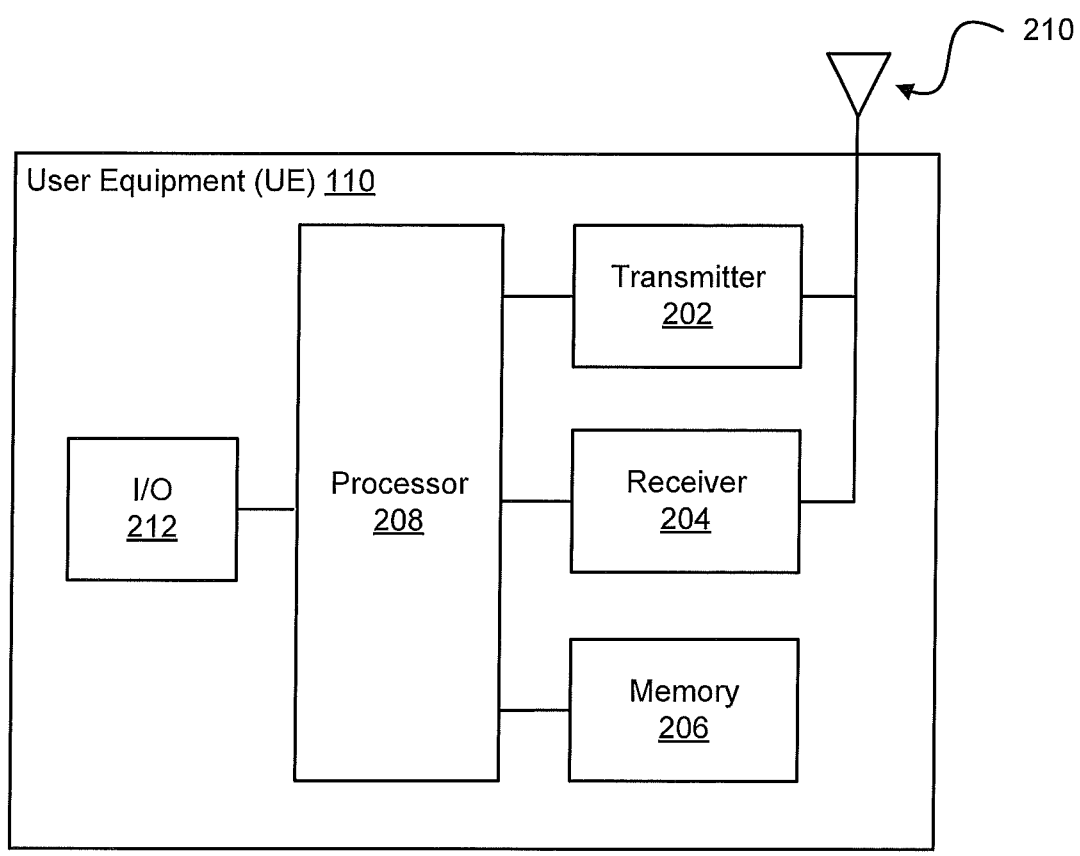
FIG. 2 illustrates an example of the details of an instance of user equipment (UE) introduced in FIG. 1.
Figure 3:
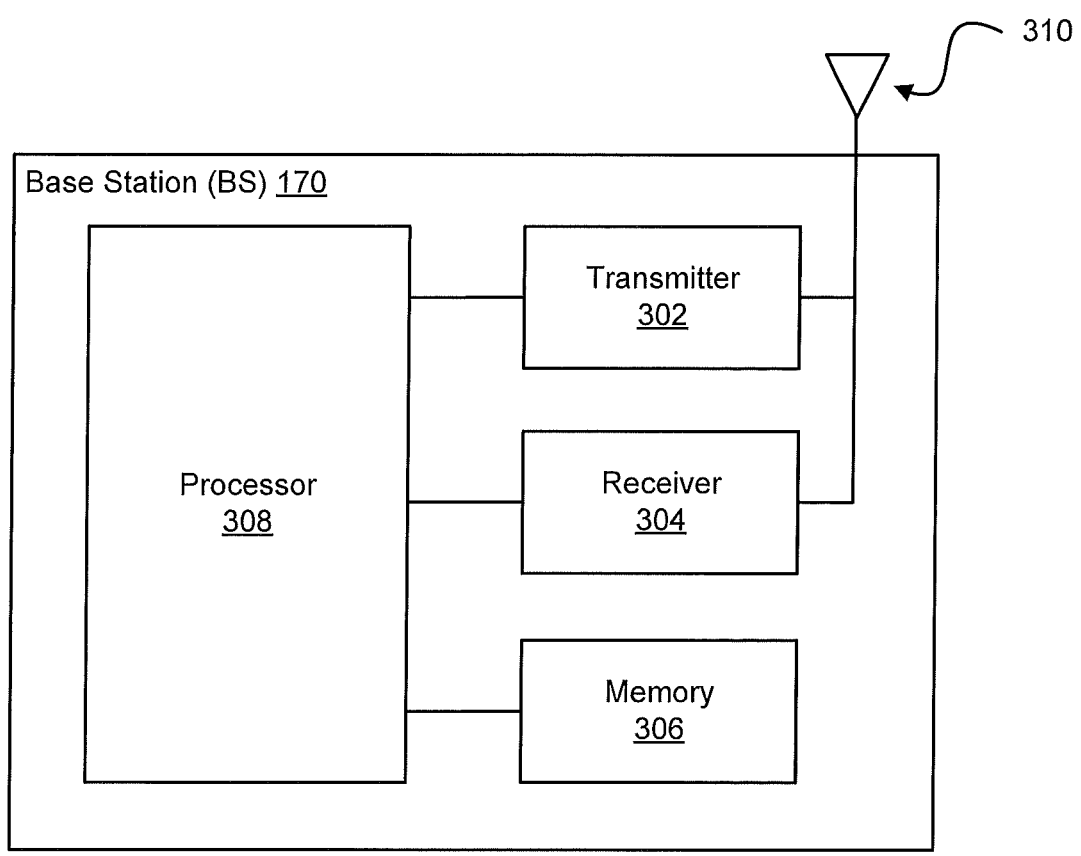
FIG. 3 illustrates an example of the details of an instance of a base station (BS) introduced in FIG. 1.
Figure 4:
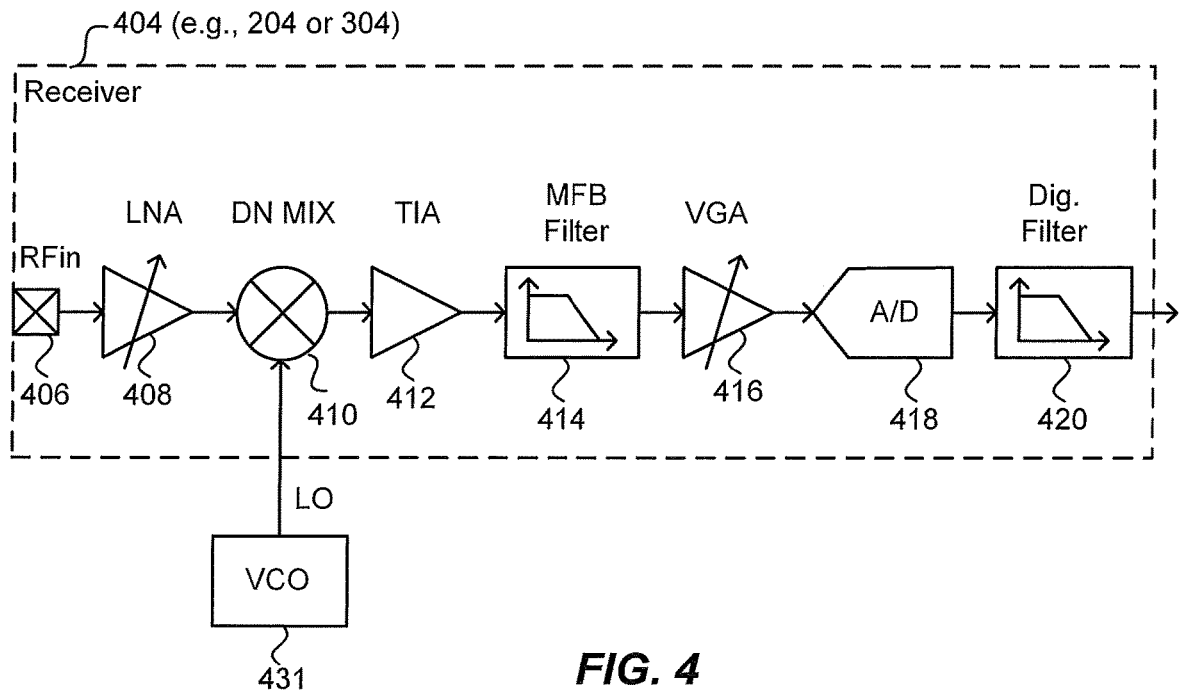
FIG. 4 illustrates an example of the details of a receiver included in UE or a BS shown in FIGS. 2 and 3.
Figure 5:
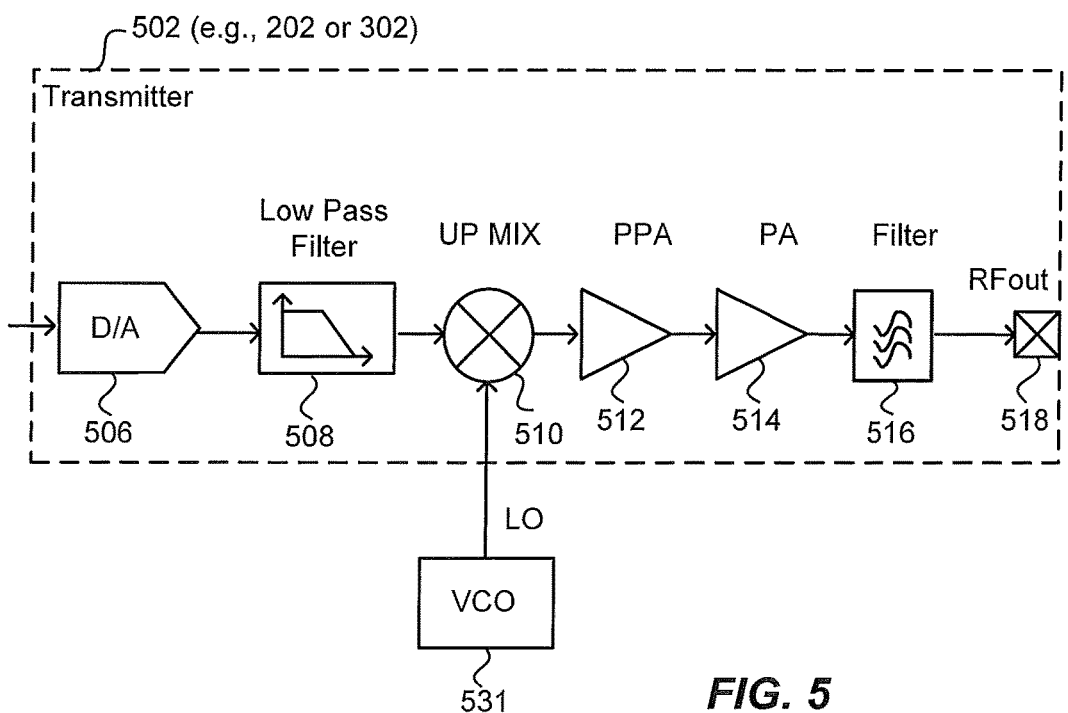
FIG. 5 illustrates an example of the details of a transmitter included in UE or a BS shown in FIGS. 2 and 3.

Before providing additional details for VCO power supply circuits of embodiments of the present technology, FIG. 1 is used to describe an example of a wireless network for communicating data, FIG. 2 is used to describe details of an example of user equipment (UE) introduced in FIG. 1, and FIG. 3 is used to describe details of an example of a base station (BS) introduced in FIG. 1. Additionally, FIGS. 4 and 5 are respectively used to describe details of examples of a receiver and of a transmitter included a UE or a BS. The VCO power supplies described herein can be used with a receiver, such as the receiver described with reference to FIG. 4, or a transmitter, such as the transmitter described with respect to FIG. 5, but is not limited thereto.

Referring to FIG. 1, illustrated therein is an example of a wireless network for communicating data. The communication system 100 includes, for example, user equipment 110A, 110B, and 110C, radio access networks (RANs) 120A and 120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

In one embodiment, the wireless network may be a fifth generation (5G) network including at least one 5G base station which employs orthogonal frequency-division multiplexing (OFDM) and/or non-OFDM and a transmission time interval (TTI) shorter than 1 ms (e.g. 100 or 200 microseconds), to communicate with the communication devices. In general, a base station may also be used to refer any of the eNB and the 5G BS (gNB). In addition, the network may further include a network server for processing information received from the communication devices via the at least one eNB or gNB.

System 100 enables multiple wireless users to transmit and receive data and other content. The system 100 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The user equipment (UE) 110A, 110B, and 110C, which can be referred to individually as an UE 110, or collectively as the UEs 110, are configured to operate and/or communicate in the system 100. For example, a UE 110 can be configured to transmit and/or receive wireless signals or wired signals. Each UE 110 represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 120A, 120B include one or more base stations (BSs) 170A, 170B, respectively. The RANs 120A and 120B can be referred to individually as a RAN 120, or collectively as the RANs 120. Similarly, the base stations (BSs) 170A and 170B can be referred individually as a base station (BS) 170, or collectively as the base stations (BSs) 170. Each of the BSs 170 is configured to wirelessly interface with one or more of the UEs 110 to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the BS 170A forms part of the RAN 120A, which may include one or more other BSs 170, elements, and/or devices. Similarly, the BS 170B forms part of the RAN 120B, which may include one or more other BSs 170, elements, and/or devices. Each of the BSs 170 operates to transmit and/or receive wireless signals within a particular geographic region or area, sometimes referred to as a "cell." In some embodiments, multiple-input multiple-output (MIMO) technology may be employed having multiple transceivers for each cell.

The BSs 170 communicate with one or more of the UEs 110 over one or more air interfaces (not shown) using wireless communication links. The air interfaces may utilize any suitable radio access technology.

It is contemplated that the system 100 may use multiple channel access functionality, including for example schemes in which the BSs 170 and UEs 110 are configured to implement the Long Term Evolution wireless communication standard (LTE), LTE Advanced (LTE-A), and/or LTE Multimedia Broadcast Multicast Service (MBMS). In other embodiments, the base stations 170 and user equipment 110A-110C are configured to implement UMTS, HSPA, or HSPA+ standards and protocols. Of course, other multiple access schemes and wireless protocols may be utilized.

The RANs 120 are in communication with the core network 130 to provide the UEs 110 with voice, data, application, Voice over Internet Protocol (VoIP), or other services. As appreciated, the RANs 120 and/or the core network 130 may be in direct or indirect communication with one or more other RANs (not shown). The core network 130 may also serve as a gateway access for other networks (such as PSTN 140, Internet 150, and other networks 160). In addition, some or all of the UEs 110 may include functionality for communicating with different wireless networks over different wireless links using different wireless technologies and/or protocols.

The RANs 120 may also include millimeter and/or microwave access points (APs). The APs may be part of the BSs 170 or may be located remote from the BSs 170. The APs may include, but are not limited to, a connection point (an mmW CP) or a BS 170 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 1 illustrates one example of a communication system, various changes may be made to FIG. 1. For example, the communication system 100 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

FIG. 2 illustrates example details of an UE 110 that may implement the methods and teachings according to this disclosure. The UE 110 may for example be a mobile telephone, but may be other devices in further examples such as a desktop computer, laptop computer, tablet, handheld computing device, automobile computing device and/or other computing devices. As shown in the figure, the example UE 110 is shown as including at least one transmitter 202, at least one receiver 204, memory 206, at least one processor 208, and at least one input/output device 212. The processor 208 can implement various processing operations of the UE 110. For example, the processor 208 can perform signal coding, data processing, power control, input/output processing, or any other functionality enabling the UE 110 to operate in the system 100 (FIG. 1). The processor 208 may include any suitable processing or computing device configured to perform one or more operations. For example, the processor 208 may include a microprocessor, microcontroller, digital signal processor, field programmable gate array, or application specific integrated circuit.

The transmitter 202 can be configured to modulate data or other content for transmission by at least one antenna 210. The transmitter 202 can also be configured to amplify, filter and a frequency convert RF signals before such signals are provided to the antenna 210 for transmission. The transmitter 202 can include any suitable structure for generating signals for wireless transmission.

The receiver 204 can be configured to demodulate data or other content received by the at least one antenna 210. The receiver 204 can also be configured to amplify, filter and frequency convert RF signals received via the antenna 210. The receiver 204 can include any suitable structure for processing signals received wirelessly. The antenna 210 can include any suitable structure for transmitting and/or receiving wireless signals. The same antenna 210 can be used for both transmitting and receiving RF signals, or alternatively, different antennas 210 can be used for transmitting signals and receiving signals.

It is appreciated that one or multiple transmitters 202 could be used in the UE 110, one or multiple receivers 204 could be used in the UE 110, and one or multiple antennas 210 could be used in the UE 110. Although shown as separate blocks or components, at least one transmitter 202 and at least one receiver 204 could be combined into a transceiver. Accordingly, rather than showing a separate block for the transmitter 202 and a separate block for the receiver 204 in FIG. 2, a single block for a transceiver could have been shown.

The UE 110 further includes one or more input/output devices 212. The input/output devices 212 facilitate interaction with a user. Each input/output device 212 includes any suitable structure for providing information to or receiving information from a user, such as a speaker, microphone, keypad, keyboard, display, or touch screen.

In addition, the UE 110 includes at least one memory 206. The memory 206 stores instructions and data used, generated, or collected by the UE 110. For example, the memory 206 could store software or firmware instructions executed by the processor(s) 208 and data used to reduce or eliminate interference in incoming signals. Each memory 206 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

FIG. 3 illustrates an example BS 170 that may implement the methods and teachings according to this disclosure. As shown in the figure, the BS 170 includes at least one processor 308, at least one transmitter 302, at least one receiver 304, one or more antennas 310, and at least one memory 306. The processor 308 implements various processing operations of the BS 170, such as signal coding, data processing, power control, input/output processing, or any other functionality. Each processor 308 includes any suitable processing or computing device configured to perform one or more operations. Each processor 308 could, for example, include a microprocessor, microcontroller, digital signal processor, field programmable gate array, or application specific integrated circuit.

Each transmitter 302 includes any suitable structure for generating signals for wireless transmission to one or more UEs 110 or other devices. Each receiver 304 includes any suitable structure for processing signals received wirelessly from one or more UEs 110 or other devices. Although shown as separate blocks or components, at least one transmitter 302 and at least one receiver 304 could be combined into a transceiver. Each antenna 310 includes any suitable structure for transmitting and/or receiving wireless signals. While a common antenna 310 is shown here as being coupled to both the transmitter 302 and the receiver 304, one or more antennas 310 could be coupled to the transmitter(s) 302, and one or more separate antennas 310 could be coupled to the receiver(s) 304. Each memory 306 includes any suitable volatile and/or non-volatile storage and retrieval device(s).

Certain embodiments of the present technology described herein can be implemented using hardware, software, or a combination of both hardware and software. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

Communication media typically embodies computer readable instructions, data structures, program modules or other data in a propagated, modulated or transitory data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

FIG. 4 illustrates details for an example of a receiver 404, which can be the receiver 204 included in the UE 110 (shown in FIG. 2) or the receiver 304 included in the BS 170 (shown in FIG. 3), but is not limited thereto. Referring to FIG. 4, the receiver 404 is shown as including an input 406 at which is received as a radio frequency (RF) signal, and thus, the input 406 can also be referred to as the RF input 406. The RF input 406 can be coupled to an antenna or a coupler, but is not limited thereto. The RF signal received by the RF input 406 is provided to a low noise amplifier (LNA) 408, which may have an adjustable gain. The LNA 408 amplifies the relatively low-power RF signal it receives without significantly degrading the signal's signal-to-noise ratio (SNR). The amplified RF signal that is output by the LNA 408 is provided to a mixer 410. The mixer 410, in addition to receiving the amplifier RF signal from the LNA 408, also receives an oscillator signal LO from a local oscillator, and adjusts the frequency of the amplifier RF signal, e.g., from first frequency to a second frequency that is lower than the first frequency. More specifically, the mixer 410 can be a down-mixer (DN MIX) that frequency down-converts the amplified RF signal from a relatively high frequency to a baseband frequency, or an intermediate frequency (IF) that is offset from the baseband frequency.

Still referring to FIG. 4, the frequency down-converted RF signal that is output from the mixer 410 is shown as being provided to a trans-impedance amplifier (TIA) 412. The TIA 412 acts as a current buffer to isolate a multi-feedback (MFB) filter 414 that is downstream of the TIA 412, from the mixer 410 that is upstream of the TIA 412. The MBF filter 414 low pass filters the frequency down-converted RF signal, to filter out high frequency signal components that are not of interest, such as HF noise. The filtered RF signal that is output from the MBF filter 414 is provided to a variable gain amplifier (VGA) 416, which is used to amplify the RF signal before it provided to an analog-to-digital converter (A/D) 418, which converts the RF signal from an analog signal to a digital signal. The digital signal output from the A/D 418 is then provided to a digital filter 420, which performs additional filtering to remove out of band signal components and attenuates quantization energy from the A/D 418. The filtered digital signal that is output by the digital filter 420 is then provided to further digital circuitry that is downstream from the digital filter 420. Such further digital circuitry can include, for example, a digital signal processor (DSP), but is not limited thereto. The same DSP, or a different DSP, can be used to implement the digital filter 420.

The local oscillator signal LO in FIG. 4 can be provided by a voltage controlled oscillator VCO system 431, which is frequently incorporated into a phase locked loop. The LO signal is provided to the mixer 410 for use in the down-conversion process. Although shown as outside of receiver 404, depending on the embodiment, the VCO system 431 can be formed on the same integrated circuit as one or more of the other elements in FIG. 4. VCOs and their power supplies are discussed further below with respect to FIGS. 6-10.

FIG. 5 illustrates details of one example of a transmitter 502, which can be the transmitter 202 included in the UE 110 (shown in FIG. 2) or the transmitter 302 included in the BS 170 (shown in FIG. 3), but is not limited thereto. Referring to FIG. 5, the transmitter 502 is shown as including an output 518 at which is provided as a radio frequency (RF) signal, and thus, the output 518 can also be referred to as the RF output 518. The RF output 518 can be coupled to an antenna or a coupler, but is not limited thereto. The RF signal provided by the RF output 518 is provided from a power amplifier PA 514 though the bandpass or notch filter 516. The filter 516 can, for example, be a duplex/SAW filter and is used to remove unwanted frequency components above and below the desired RF frequency range from the amplified RF output signal generated by PA 514. The power amp PA 514 receives its input from a power pre-amplifier PPA 512, which initially receives the up-converted signal to be transmitted from the mixer 510.

Still referring to FIG. 5 the signal to be transmitted is received from the processor 208 of UE 110 of FIG. 2 or processor 308 of BS 170 of FIG. 3 at the digital to analog converter 506, with the digitized signal being filtered by low pass filter 508 to initially remove any high frequency noise before being up-converted at the mixer 510. The mixer 510, in addition to receiving the analog version of the signal, typically an intermediate frequency (IF) signal, from the low pass filter 508, also receives an oscillator signal LO from a local oscillator, and adjusts the received IF signal, e.g., from first frequency to a second frequency that is higher than the first frequency. More specifically, the mixer 510 can be an up-mixer (UP MIX) that frequency up-converts the IF signal to an RF signal.

The local oscillator signal LO in FIG. 5 can be provided by a voltage controlled oscillator (VCO) system 531, which is frequently incorporated into a phase locked loop. The LO signal is provided to the mixer 510 for use in the up-conversion process. Although shown as outside of transmitter 502, depending on the embodiment, the VCO system 531 can be formed on the same integrated circuit as one or more of the other elements in FIG. 5. VCOs and their power supplies are discussed further below with respect to FIGS. 6-10.

More specifically, the following disclosure describes power supply structures for use with VCOs, such as might be implemented on a Complementary Metal Oxide Semiconductor (CMOS) IC in telecommunications equipment. Prior power supplies for a VCO were typically voltage or current sources; however, as tolerances for the electrical components of the IC process increase, the variation in the performance of the VCO increases, often causing it to miss critical performance specifications when mass produced. To mitigate the variation, the VCO's supply is sometimes made programmable, allowing it to be adjusted as the frequency of the VCO is changed or its operating temperature changed. Another approach is to use a duplicate circuit of the VCO's active components in an attempt to mirror the behavior of the VCO, so that the VCO's supply could be adjusted based on the variation of those active devices. The limitation of these approaches is that none of them can mirror the actual performance of the VCO, since the VCO is oscillating. An oscillating circuit has characteristics associated with the quality factor of its resonator, which varies with tolerances that are not reflected by simple active devices or programmable sources. Creating a duplicate oscillating circuit to mirror the behavior of the VCO can create a frequency that would interfere with the frequency of the VCO itself, causing spurs. Therefore, none of these prior art approaches completely compensate for the variation in the VCO due to tolerances.

Other approaches include employing automatic gain control to improve the start-up time of crystal oscillators, where a crystal is used in place of the inductor and capacitor resonator. This approach employs a traditional Automatic Gain Control (AGC) loop, with an error integrator providing start-up times in the millisecond range, which is far too slow for modern transceivers which require start-up times an order of magnitude faster or more. When the start-up settling time of the VCO is too slow, it causes the frequency of the communications equipment to slowly drift at the beginning of communication, resulting in information loss or error.

As noted, as CMOS technology shrinks the tolerances of the components' values on the IC increase, so that these tolerances cause wide variations in the performance of the circuits on the IC. For example, the Q, or quality, factor of a VCO's capacitors can vary as much as a factor of 7 in some processes. The Q-factor of these capacitors affects the VCO's amplitude, or level, by changing the VCO impedance the power supply needs to drive. If the impedance becomes too low for a fixed supply current, the VCO could stop functioning altogether. The structure and methods described with respect to FIGS. 6-10 can help to solve the problem. In a closed loop mode, the VCO system can continuously monitor the amplitude of the VCO and adjust its supply voltage in order to keep the VCO operating within an acceptable range. The power supply accomplishes this by feeding the VCO amplitude back to itself, comparing it to a desired result, and then modifying the supply voltage until the desired result is achieved. The approach here provides an improvement over traditional AGC feedback by eliminating the use of an error integrator of the AGC loop, which would greatly increase the start-up time of the VCO.

In an open loop mode, the result of the closed loop mode is monitored by an analog to digital converter and a controller, such as a microprocessor. The controller can set a digital to analog converter to provide a substantially equivalent result as the first, closed loop mode. The controller can then switch from the closed loop mode to the open loop mode providing an extremely stable VCO supply.

Figure 6:
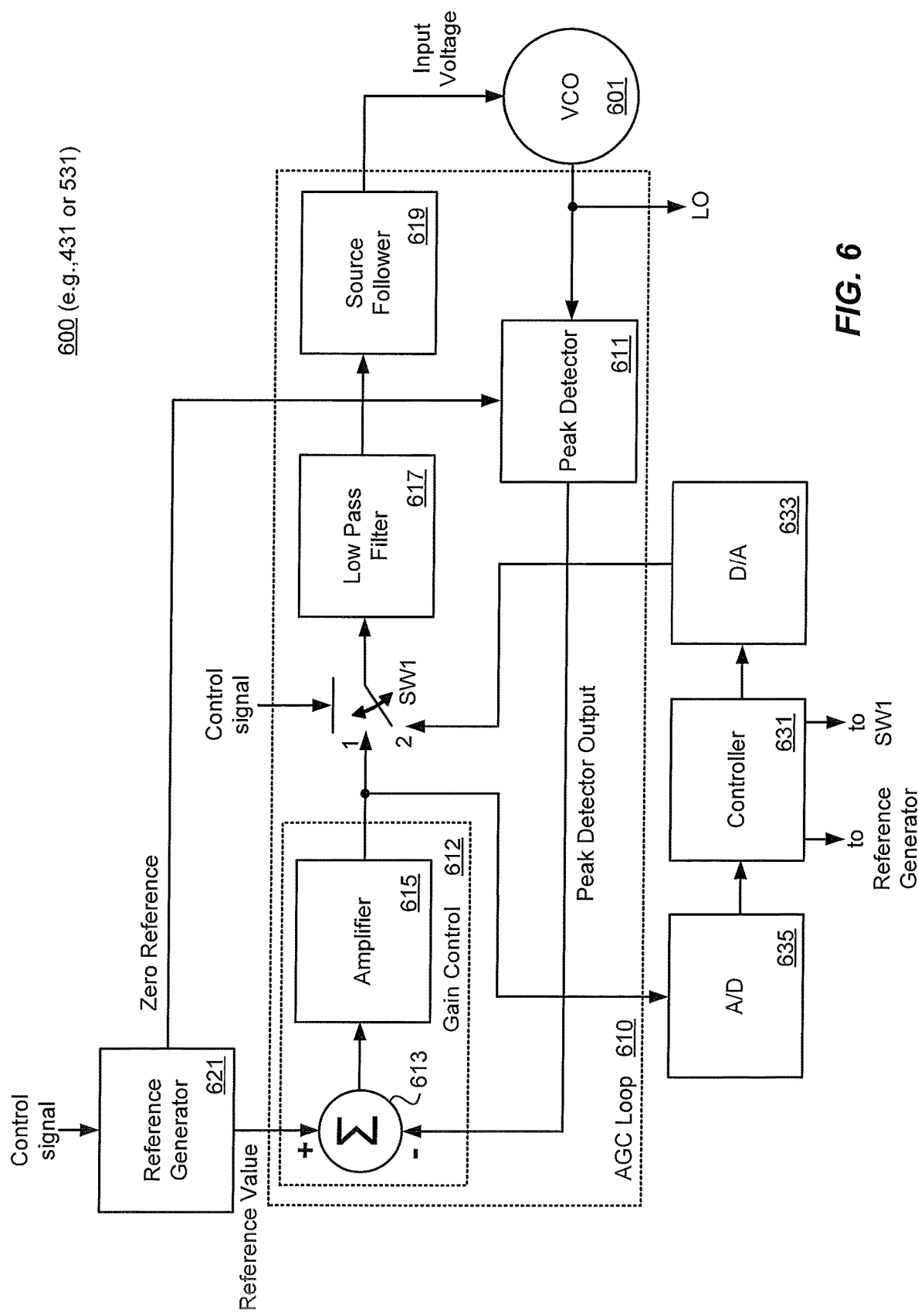
FIG. 6 illustrates an embodiment of a VCO system including a VCO and a power supply with a closed loop mode with automatic gain control and a digital, open loop mode.

FIG. 6 illustrates the main functional blocks for an embodiment of a VCO system 600 of VCO 601 and a power supply for the VCO 601. A switch SW1, when in position 1, will conect the amplifier 615 to provide the input voltage to VCO 601 in a closed loop mode. In position 2, the system will operate in the open loop mode and the controller 631 will provide the input voltage from digital to analog converter (D/A) 633. For example, switch SW1 can be implemented as a transistor, although other embodiments can use mechanical or other types of switches for making and breaking of these connections.

Considering the elements for the closed loop mode when SW1 is in position 1 at a high level, the power supply elements include: a reference generator 621 providing the information about the desired amplitude of the VCO signal; a summing (or difference function) circuit 613; an amplifier 615 with gain; a low pass filter 617; a source follower 619; and a peak detector 611. The output waveform of the VCO 601 is an alternating current (AC) signal that is passed to the peak detector 611, which converts the AC amplitude to a representative direct current (DC) level. That DC level is compared by the summing circuit 613 to a reference value DC voltage from the reference generator 621 that represents the desired VCO amplitude as a difference voltage. The difference voltage from the summing circuit 613 is multiplied by the gain of the amplifier 615 and passed to the low pass filter 617. The low pass filter 617 reduces the noise of the circuitry in the AGC loop without changing the multiplied difference voltage. The output of the low pass filter 617 is input to the source follower circuit 619, which acts to impedance match the high impedance of the output from low pass filter 617 to the low impedance of the supply node to VCO 601. The VCO amplitude is proportional to the input voltage from the power supply. If the VCO amplitude is below the desired level, then the difference voltage will be high, increasing the VCO supply voltage. If the VCO amplitude is above the desired level, then the difference voltage will be low, decreasing the VCO supply voltage. When the VCO amplitude is at the desired level the difference voltage will remain constant as will the VCO supply voltage.

The elements used for the second, digital open loop mode can include an analog to digital converter (A/D) 635, the controller 631 and D/A 633. The second mode can share the "super filter" portion of low pass filter 617 and source follower 619 with the closed mode. In closed loop mode, switch SW1 will be in position 2. When the closed loop mode has sufficiently settled, meaning the voltage at the input to the low pass filter 617 is within ½ bit resolution of the D/A 633, the controller 631 reads this voltage via the A/D 635. The controller 631 will then set the D/A 633 output voltage to substantially the same voltage as the AGC loop and can then toggle the switch SW1 from position 1 to position 2. This information can be stored by the controller 631 and can be re-applied to the low pass filter 617 at the start-up of the VCO 601 without the need for operating the analog loop each time the VCO is disabled and re-enabled. The system can also switch back to closed loop mode, if desired, to update the value for the voltage to supply to the low pass filter 617 in open loop mode.

The operation of the power supply of the VCO system 600 of FIG. 6 is independent of the process tolerances of the circuitry. Therefore, the amplitude of the VCO system will automatically adjust to the desired level set by the reference value independently of the variation in VCO operation normally seen with a fixed supply voltage, since the closed AGC loop will adjust the VCO input voltage as necessary. The arrangement of FIG. 6 uses a simple amplifier 615, rather than an error integrator function. An error integrator function compares the difference voltage with a summing node; but rather than provide a voltage multiplied by the gain of the amplifier 615, with an error integrator function the difference voltage is instead integrated over time.

Considering the embodiment of the VCO system 600 of FIG. 6 further, the closed loop elements include the VCO 601, the reference generator 621, and the elements of the automatic gain control (AGC) loop 610, which includes the elements of the gain control block 612 of summing circuit 613 and amplifier 615, the low pass filter 617, and the source follower 619. The open loop elements include A/D 635, controller 631, and A/D 633. In position 1, SW1 connects the amplifier 615 to provide the input voltage and in position 2, SW1 connects the controller 631 to provide the input voltage thought D/A 633. The VCO 601 generates an output waveform LO whose amplitude is dependent on the input voltage from the AGC loop 610, where the input voltage is based on the amplitude of the output waveform LO relative to a reference value.

In closed loop mode, the peak detector 611 receives the AC output waveform LO of the VCO 601. Depending on the embodiment, the output waveform LO can be a differential output, or a single-ended output referenced to ground. The peak detector 611 converts the AC amplitude of the VCO output waveform to a representative DC level. More detail on the peak detector 611 is given with respect to the embodiment of FIG. 7.

The DC level output from the peak detector 611 is compared to a DC voltage from the reference generator 621 that represents the desired VCO amplitude at the summing circuit 613, which can be any of a number of circuits for this purpose. The reference value from reference generator 621 and the output from peak detector 611 are combined to provide a difference voltage that is a function of the difference between these values, as indicated by the + and − indications. For example, the reference value and peak detector output could respectively be connected to the − and + inputs of a difference amp for a summing circuit.

The reference generator 621 provides a reference value with the information about the desired amplitude of the output signal LO of the VCO 601. Depending on the embodiment, the reference value can be fixed, such as being set as part of the initial testing of the device, or a programmable reference value. If programmable, the reference value can be selected by a controller 631, such as a microprocessor, based on user inputs, external monitoring, or some combination of these and/or other inputs. For example, the VCO system 600 may be configured to provide the local oscillator signal at different frequencies which would use different amplitudes of the output waveform LO. The controller could program the reference value according to the selected output waveform frequency based, for example, on a look up table. Depending on the embodiment, the reference values can be analog voltage levels or, as for the embodiment of FIG. 9 below, a digital value. In some embodiments, the reference generator 621 will also provide a zero reference value for the peak detector circuit, where the zero reference value corresponds to an output waveform LO of zero amplitude. Examples of reference generators are given below with respect to FIGS. 8A-8C.

The difference voltage from the summing circuit 613 is passed on to the amplifier 615, where it is multiplied by the gain of amplifier 615. The amplifier 615 can be any of various designs known in the art. The amplifier 615 can be relatively low gain and not contribute to the phase noise of the VCO 601. Use of a low gain amplifier not only reduces the noise of the AGC loop 610, but also allows the total loop gain to be less than unity, giving the circuit unconditional stability.

The output of amplifier 615 is passed to the "super filter" combination of a low pass filter 617 and source follower 619. The low pass filter 617 reduces the noise of the circuitry in the AGC loop 610 without changing the multiplied difference voltage. The source follower 619 acts to impedance match the high impedance low pass filter output to the low impedance input voltage supply node of VCO 601. Both the low pass filter 617 and the source follower 619 can be any of various known implementations.

In some embodiments, the low pass filter 617 filter may be bypassed in early portions of the closed loop mode. (Although not illustrated in FIG. 6 to simplify the representation, this can be implemented similarly to arrangement illustrated in the embodiment of FIG. 9.) The controller 631 or other control circuit can bypass the low pass filter 617 during start up to allow the AGC loop to more rapidly reach an approximate input voltage. After an initial period, the low pass filter 617 can be switched back into the AGC loop 610 to smooth out operation. The initial period can be based on a delay value or by the controller 631 monitoring the convergence of the difference value from the summing circuit 613. In alternate embodiments, the source follower 619 can be replaced by a unity gain amplifier, but then the low pass filter 617 would not remove any of the unity gain amplifier noise. If degraded noise performance is acceptable, both the low pass filter 617 and the source follower 619 can be omitted and the amplifier 615 can be used to directly drive the VCO 601.

The VCO system 600 can be implemented in a CMOS process. Embodiments of the peak detector circuit 611 can be implemented by employing parasitic bipolar devices within the CMOS process. A parasitic device, as the term is used here, is a transistor that exists as a byproduct of the CMOS process, but one not intended to exist by design, as in a Bi-CMOS process. In some instances, these parasitic devices can be detrimental to a design, becoming active and causing the IC to latch in a state it cannot recover from (latch-up) without removing power; but in certain embodiments described herein they are being put to use as elements of the VCO system 600.

The peak detector 611 connects directly to the VCO 601, and should not present a load that impairs its performance. When implemented in a CMOS process by using Metal Oxide Semiconductor (MOS) transistors, the transistors should be physically small so the gate capacitances of the MOS transistors do not impact the frequency range of the VCO 601. Unfortunately, small MOS transistors have very high flicker noise and degrade the close in-phase noise performance of the VCO 601. Bipolar transistors do not have a significant capacitance associated with their inputs and have much lower flicker noise than MOS transistors, making them more desirable for use in the peak detector 611.

Looking now at the open loop elements A/D 635, controller 631, and D/A 633 of FIG. 6, while operating in the closed loop mode, the controller 631 can monitor the output of amplifier 615 via A/D 635. Both A/D 635 and D/A 633 can be implemented by well-known structures. When in closed loop mode and the AGC loop has sufficiently settled, meaning the voltage from the amplifier 615 at the input to the low pass filter 617 is within ½ bit resolution of the D/A 633, the controller 631 will read the voltage via the A/D 635. The controller 631 can then set the D/A 633 output voltage to substantially the same voltage as from the AGC loop and can then toggle the switch SW1 from position 1 to position 2. This information can be stored by the controller 631, and can be re-applied to the low pass filter 617 at the start-up of the VCO 601, without the need for operating the analog loop each time the VCO 601 is disabled and re-enabled. The controller 631 can also toggle the switch SW1 to position 1 for the closed loop mode to update the value of the input voltage.

Figure 7:
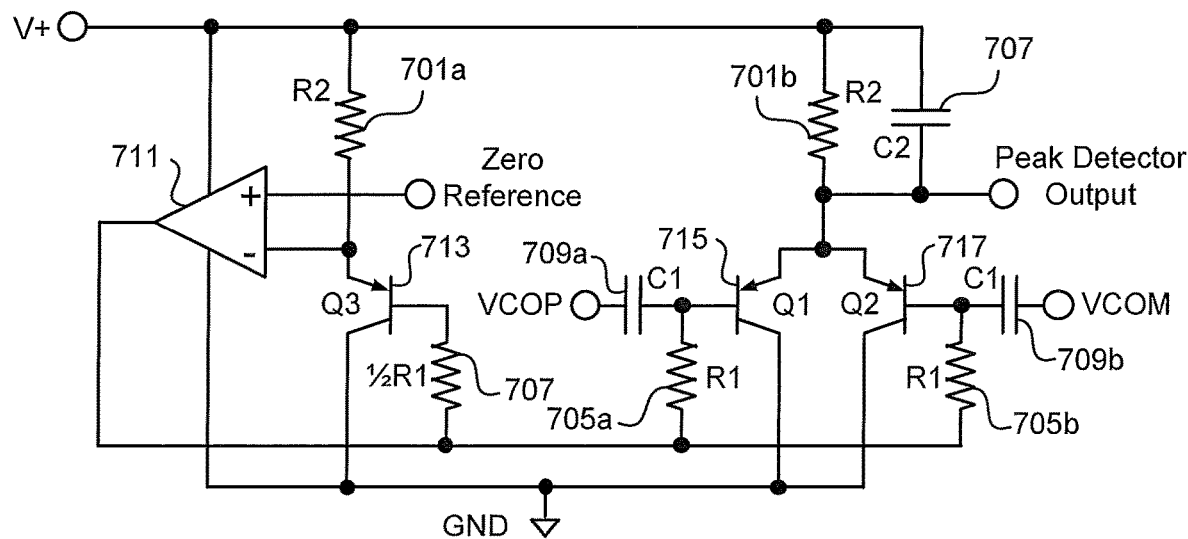
FIG. 7 illustrates an embodiment of peak detection circuit that can be implemented as bipolar devices on a CMOS circuit.

FIG. 7 presents an embodiment for a topology for a peak detector, such as can be used for the peak detector 611 of FIG. 6, with low noise and reduced loading of the VCO 601. The shown embodiment of FIG. 7 is implemented as a negative peak detector, while the in the embodiment of FIG. 6, the peak detector 611 is implemented as a positive peak detector, providing a peak detector output that increases as the amplitude of the output waveform LO from VCO 601 increases. If the peak detector 611 is instead implemented as a negative peak detector, as described here, the polarity of the summing circuit 613 would be reversed.

In FIG. 7, like labelled resistors and capacitors have like resistance and capacitance values, respectively. More specifically, both of resistors 701a and 701b have the same resistance of R2, and resistors 705a and 705b have a resistance of R1, while the resistance of resistor 707 is ½ R1. Both of capacitors 709a and 709b have the same capacitance of C1, which need not equal the capacitance C2 of capacitor 707. Transistor Q3 713 is the size of transistors Q1 715 and Q2 717 in parallel, while the base resistor 707 of transistor Q3 713 is the size as base resistors 705a and 705b of Q1 715 and Q2 717 in parallel. This makes the circuitry of Q3 713 the DC equivalent of the combination of the circuitry of transistors Q1 715 and Q2 717. The zero reference input can come from the reference generator 621 by way of a resistive voltage divider, for example, as discussed below with respect to FIGS. 8A-8C.

Still referring to FIG. 7, an operational amplifier 711 maintains the DC emitter voltage of transistors Q1 715, Q2 717, and Q3 713 at the reference zero voltage independently of process and temperature variations. The embodiment of FIG. 7 is for a VCO 601 with a differential output, where the differential input signals VCOP and VCOM for peak detector 611 are the differential outputs from the VCO 601. When the voltage swing of either VCOP or VCOM goes negative, transistors Q1 715 or Q2 717 will turn on, respectively, and the common emitter voltage of Q1 715 and Q2 717 will swing below the DC zero reference tracking the negative peak voltage of the VCO 601 and charging capacitor C2 707. This common emitter voltage is the peak detector output, which will be negative with respect to the zero reference, providing an indication of the VCO amplitude as lower voltages indicate larger amplitudes. When the voltage swing of either VCOP or VCO goes positive, transistor Q1 715 or Q2 717 will respectively turn off. When both transistors Q1 715 and Q2 717 are off, indicating no VCO amplitude, capacitor C2 707 will discharge through the common emitter resistors of Q1 715 and Q2 717 and return to the zero reference. The time constant of R2 and C2 determine how fast the peak detector output will track the VCO amplitude, and how fast the AGC loop will respond to VCO amplitude changes.

Figure 8C:
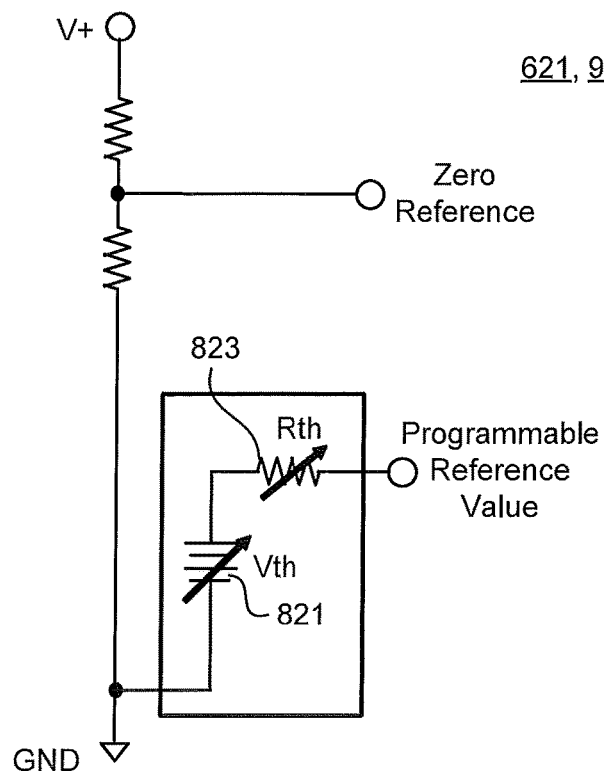
FIGS. 8A, 8B, and 8C are some embodiments of reference voltage generators.
Figure 8B:
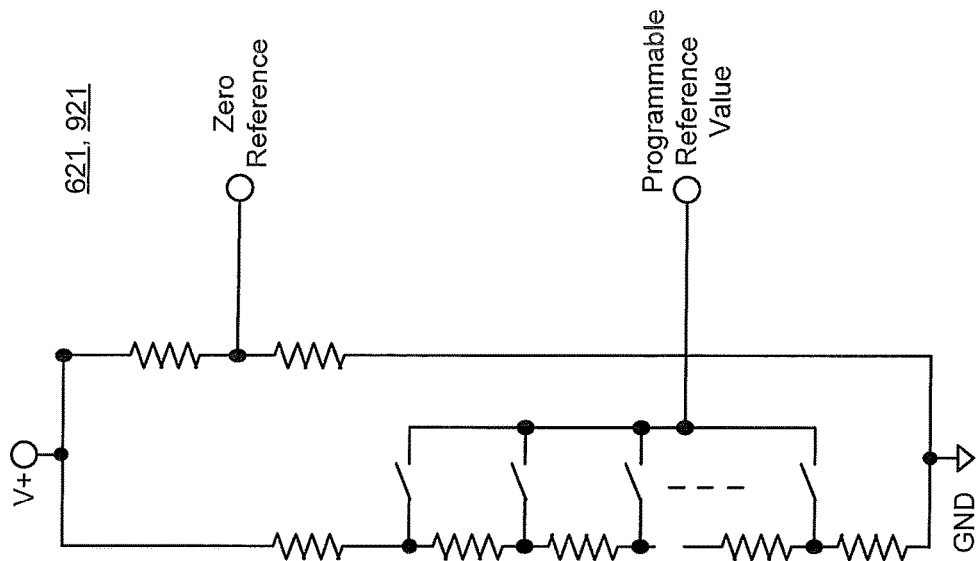
Figure 8A:
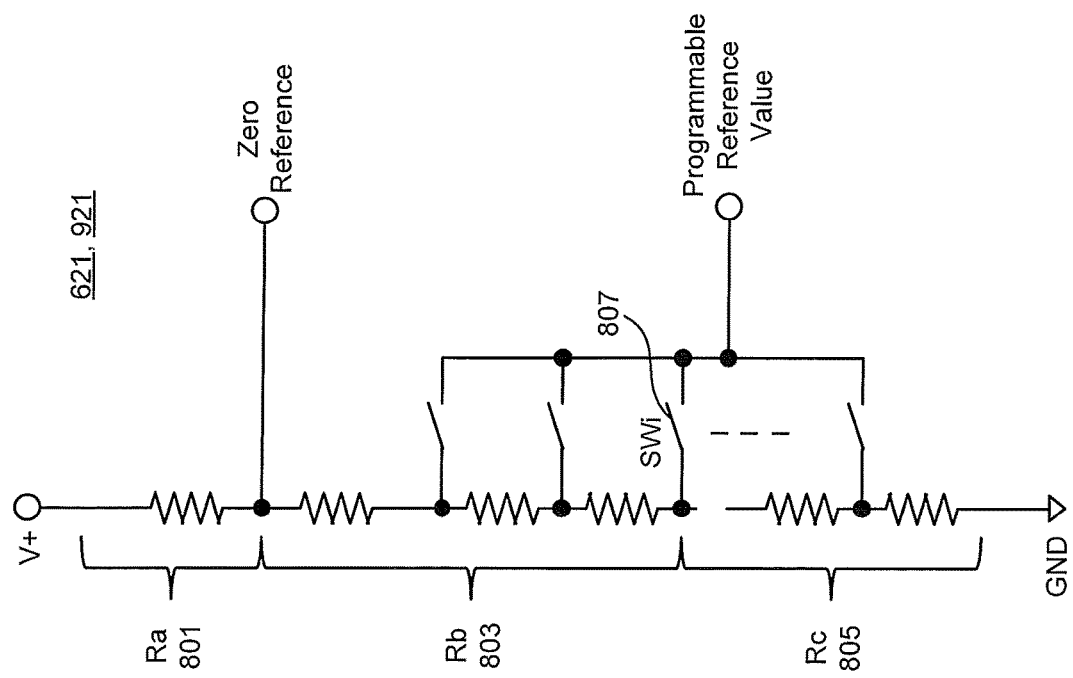

FIGS. 8A-8C illustrate some embodiments for the reference generator 621 (and also 921 of FIG. 9, below). In FIG. 8A, the outputs of the reference generator 621, which can include a programmable reference output and a zero reference output, can be derived by a voltage divider formed of series connected resistors, connected to a stable voltage source V+. In FIG. 8A, both the zero reference and the programmable reference values are from taps of the same resistor chain. In the arrangement of FIG. 8A, the chain of resistors are shown grouped into a first resistance Ra 801, a second resistance Rb 803, and a third resistance Rc 805. The zero reference value is taken from a fixed tap between Ra 801 and Rb 803 plus Rc 805, where the ratio of (Rb+Rc) to the sum of the resistances (Ra+Rb+Rc) will set the zero reference value. The reference value input into the summing circuit can be programmed by closing a selected one of the switches, such as SWi 807, allowing the VCO amplitude to be programmed by the controller 631, if so desired. Closing the switch SWi 807 would program the reference value to the tap between Ra 801 plus Rb 803 and Rc 805, with the corresponding reference value at V+ times (Rc/(Ra+Rb+Rc)).

The embodiment of FIG. 8B functions similarly to that of FIG. 8A, except that the zero reference has its own fixed resistance divider. FIG. 8C is another embodiment, where the zero reference is provided as in FIG. 8B by a fixed resistive divider, while the programmable reference value is set by a programmable voltage source Vth 821 in series with the programmable resistance Rth 823.

The AGC loop 610 of the closed loop of VCO system 600 provides low noise, fast settling times and unconditional stability. Traditional AGC arrangements were noted to employ an error integrator, which typically involves a high gain amplifier. The low frequency flicker noise of CMOS amplifiers with high gain is very detrimental to the phase noise of the VCO, and it is difficult to reduce this noise to acceptable levels even with low pass filters implemented on the integrated circuit. In the arrangement of FIG. 6, the amplifier 615 is relatively low gain and does not contribute to the phase noise of the VCO 601. The arrangement of FIG. 6 also avoids the use of an error integrator, where an error integrator is a time dependent function having a time constant, usually exponential in nature. This means an AGC loop with an error integrator will only asymptotically approach the desired supply voltage over time, referred to as its settling time. For a VCO used in communications equipment, this settling time results in a slow shift in the VCO's frequency, and therefore errors, in the transmitted or received information until the input voltage supplied by the VCO's power supply is very close to its final value. In contrast, the approach in FIG. 6 uses a difference amplifier 615 that eliminates the settling time of the error integrator, allowing the communications equipment to begin sending or receiving information more quickly without errors. Finally, the low gain of amplifier 615 in the arrangement of FIG. 6 not only reduces the noise of the AGC loop, but also allows the total loop gain to be less than unity giving the circuit unconditional stability. This is again in contrast to the use of a high loop gain, as the phase shift around the loop is important since improper phase margin can cause the loop to oscillate. The digital open loop mode provides an extremely stable supply, which is unconditionally stable and can be calibrated to the closed loop's result for optimal VCO operation. More generally, the arrangement of FIG. 6 has the advantage of having the power supply of VCO system 600 automatically adjust to the optimum VCO amplitude over process and temperature variations, providing better frequency stability and noise performance for the communications equipment.

Figure 9:
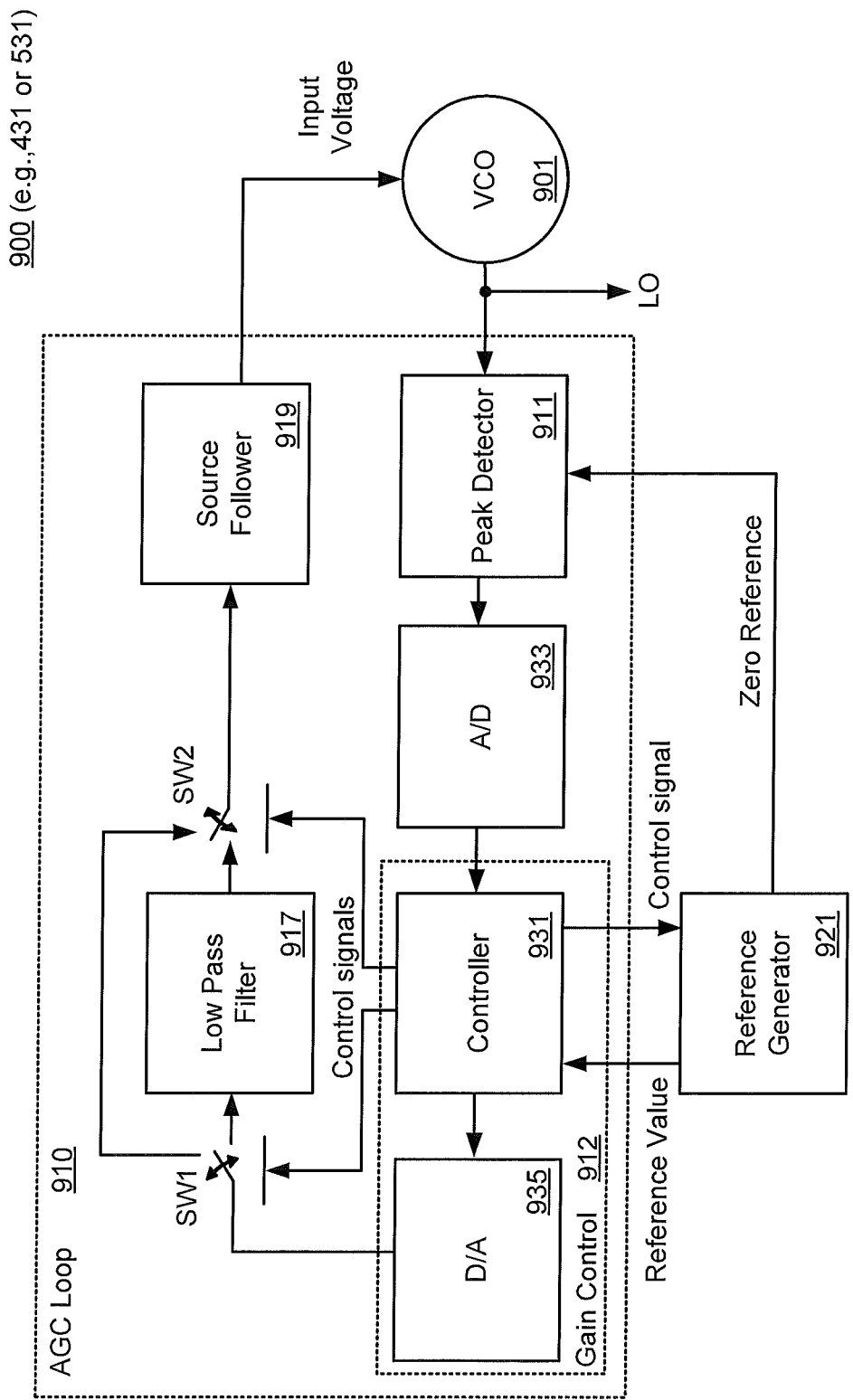
FIG. 9 illustrates another embodiment of a VCO system including a VCO and a power supply with a closed loop mode with automatic gain control and a digital, open loop mode.

FIG. 9 shows an alternative embodiment for a VCO system 900, where in the closed loop mode an analog to digital converter (A/D) 933, controller 931 (typically a microprocessor), and a digital to analog converter (D/A) 935 are part of the AGC loop 910 of the power supply. The controller 931 and D/A 935 are the gain control block 912 and perform the functions of the summing circuit 613 and amplifier 615 in the closed loop for the embodiment of FIG. 6. In the dynamic closed loop mode, the peak detector 911 again monitors the amplitude of a VCO 901, and A/D 933 sends the amplitude information to a controller 931. The controller 931 compares the A/D amplitude information with a programmable reference value from the reference generator 921, where this can be a digital value or an analog voltage value converted to a digital value. The reference value can be programmed by the controller 931.

The controller 931 sends information to the D/A 935, whose output voltage is input to a low pass filter 917 and a source follower 919, producing the VCO input voltage. In the AGC loop, the controller 931 compares the output from peak detector 911 to the reference value from the reference generator 921; and if the VCO amplitude is too low, the controller 931 increases the voltage of D/A 935, raising the VCO supply and increasing the VCO amplitude. If the VCO amplitude is too high, the controller 931 decreases the voltage from D/A 935, lowing the VCO input voltage and decreasing the VCO amplitude. Once the VCO amplitude is at the desired level as set by the reference value, the controller 931 will maintain the D/A 935 voltage at that level, creating a fixed and stable VCO supply.

The raising and lowering of the voltage from D/A 935 can be performed one code at a time, allowing the AGC loop 910 to track changes in the VCO amplitude dynamically. The rate of change is controlled by the rate at which the A/D 933 is polled for new information. The controller 931 can use switches SW1 and SW2 to by-pass the low pass filter during start up; and if degraded noise performance is acceptable, both the low pass filter 917 and the source follower 919 can be omitted and D/A 935 can be used to directly drive the VCO 901. For example, switches SW1 and SW2 can be implemented as transistors, although other embodiments can use mechanical or other types of switches for making and breaking of these connections.

For the embodiment of FIG. 9, the noise of the peak detector 911 is irrelevant since it does not contribute to the noise of D/A 935 or the loop in this embodiment, allowing the peak detector 911 to be constructed either from MOS devices or from bipolar devices as discussed above with respect to FIG. 7. In open loop mode, the controller 931 sustains the D/A 935 value at the last one determined in closed loop mode. The output of the peak detector 911 is essentially a linear function of VCO amplitude, allowing the AGC loop to perform a simplified search algorithm where only 2 measurements are made at the extremes of the VCO amplitude range, and then interpolation can be used to determine the correct D/A setting for optimal VCO operation.

The advantages of the embodiment of FIG. 9 are the same as those of the embodiment of FIG. 6: low noise, fast settling times and an unconditionally stable AGC loop if the response time of the controller is set properly. If a linear interpolation is used to determine the setting of D/A 935 as described above, the response time of the AGC loop can be very fast as required in communications equipment. As the peak detector 911 does not contribute to VCO noise, embodiments can use small MOS devices to minimize the loading on the VCO 901. More generally, the arrangement of FIG. 9 again has the ability to have the input voltage supplied to VCO 901 automatically adjust to the optimum VCO amplitude over process and temperature variations, providing better frequency stability and noise performance for the communications equipment.

Figure 10:
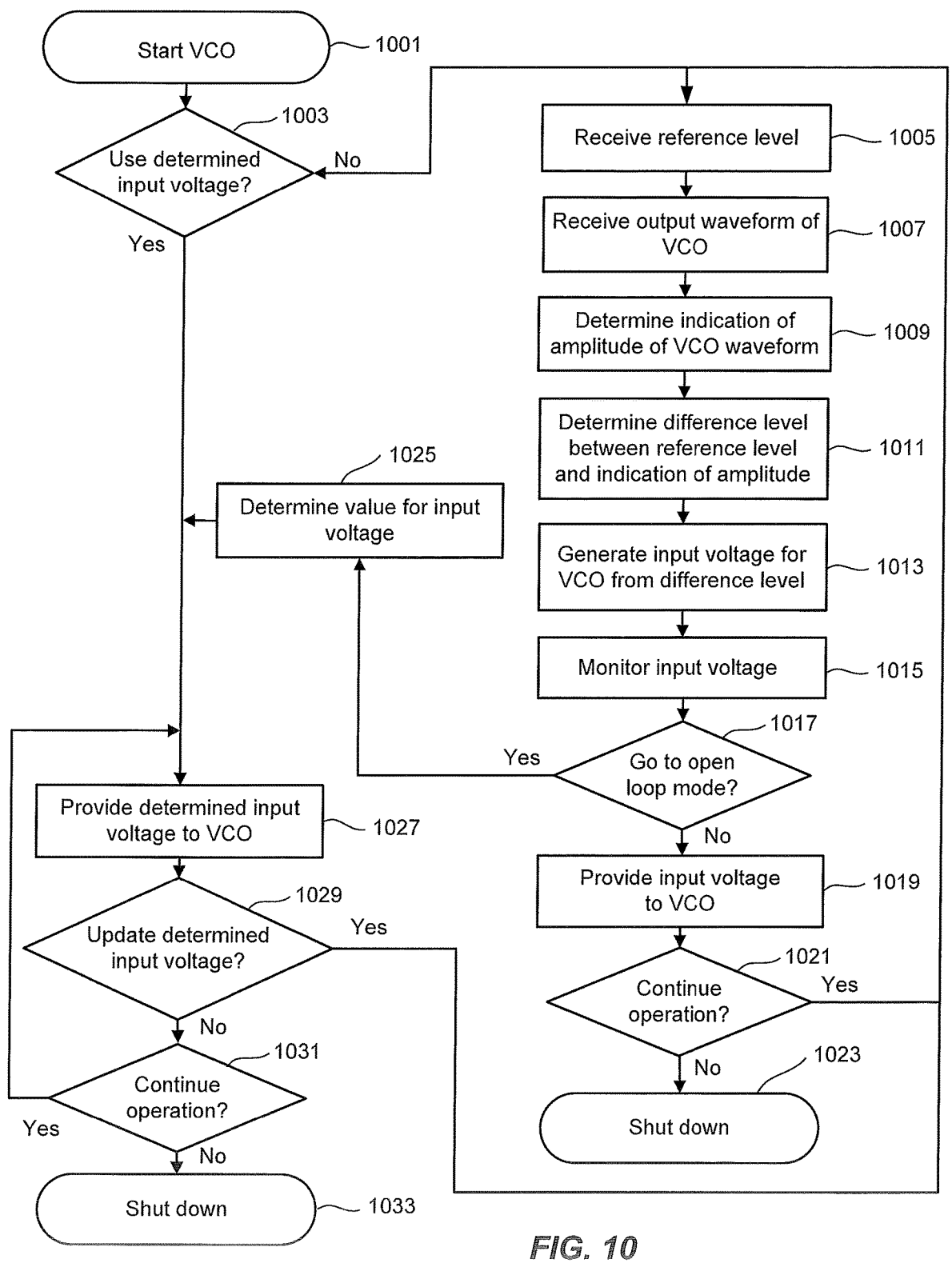
FIG. 10 is a high-level flow diagram that is used to summarize methods for operating of a power supply for a VCO according to various embodiments of the present technology.

FIG. 10 is a high-level flow diagram that is used to summarize methods for operating of a dual power supply for a VCO according to various embodiments of the present technology. Beginning at 1001, the VCO 601, 901 starts operation, generating the AC oscillator waveform LO. At 1003 the controller 631, 931 decides whether to operate in an open loop mode, using an input voltage determined previously (Yes path), or to go to closed loop mode (No path).

Considering the closed loop mode first (No path from 1003), the summing circuit 613 or controller 931 receives the reference value corresponding to the desired amplitude of the AC oscillator waveform LO from the reference generator 621, 921 at 1005. The AC oscillator waveform LO is received at the peak detector 611, 911 at 1007. Although shown in the order of 1005 and then 1007 in FIG. 10, these can be performed in either order and will typically be occurring concurrently when the closed AGC loop of the power supply is in operation.

At 1009, the peak detector 611, 911 determines an indication of the amplitude of the output waveform LO of VCO 601, 901. This can be a DC voltage level that is then supplied to the summing circuit 613 or digitized at A/D 933 and supplied to the processor 931. A difference level between the reference level from 1005 and the indication of amplitude from 1009 are then compared to determine a difference level by summing circuit 613 or controller 931 at 1011. From this difference level, the input voltage for VCO 601, 901 is then generated at 1013. In the embodiment of FIG. 6, the input voltage comes from amplifier 615. In the embodiment of FIG. 9, the input voltage is generated by D/A 935 based on a digital value from controller 931.

The controller 631, 931 monitors the closed loop input voltage at 1015. In the embodiment of FIG. 6, this is done through A/D 635. At 1017, the controller determines whether to go open loop mode (Yes) or continue in the closed loop mode (No). When the closed loop input voltage has stabilized, the Yes path goes to 1025 and sets the open loop input voltage at the level determined in the closed loop mode and continues on to 1027 and operates in the open loop mode. If the input voltage has not yet stabilized, the flow continues on to 1019.

At 1019 the input voltage is then provided to VCO 601, 901 through low pass filter 617, 917 and source follower 619, 919. As discussed above with respect to FIGS. 6 and 9, the low pass filter 617, 917 may initially be bypassed to speed up operation at start up, and some embodiments may omit both of the low pass filter 617, 917 and source follower 619, 919. As long the VCO system continues to operate using the AGC loop, at 1021 the flow will loop back to 1005. If instead the VCO is to be shut down at 1021, the flow moves to 1023 and ends.

Open loop operation begins at 1027, either from 1003 or 1025. In either case, the controller 631,931 provides the previously determined input voltage from D/A 635, 935 to the super filter combination of low pass filter 617, 917 and source follower 619, 919, and then on to VCO 601, 901. At 1029, the controller determines whether to update the closed loop input voltage, either going to 1005 to update the value (Yes) or continues on in the open loop mode (No). If the not going back to closed loop mode, the flow moves on to 1031 to either continue open loop operation (Yes) by looping back to 1027, or shut down at 1033 in response to a shutdown command.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

The disclosure has been described in conjunction with various embodiments. However, other variations and modifications to the disclosed embodiments can be understood and effected from a study of the drawings, the disclosure, and the appended claims, and such variations and modifications are to be interpreted as being encompassed by the appended claims. In the claims, the word "comprising" does not exclude other elements or steps, and the indefinite article "a" or "an" does not exclude a plurality.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope be defined by the claims appended hereto.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An oscillator system, comprising:
   a voltage controller oscillator (VCO) configured to generate an output waveform having an amplitude based on an input voltage;
   a reference generator configured to provide a reference value;
   an automatic gain control loop configured to receive the output waveform, determine an indication of the amplitude of the output waveform, and generate a difference between the reference value and the indication of the amplitude of the output waveform, the automatic gain control loop comprising:
- a source follower circuit configured to supply the input voltage to the VCO; and
- a low pass filter configured to filter the input voltage before the input voltage is supplied to the source follower circuit; and a controller configured to operate the oscillator system in both a first mode and a second mode:
- the controller, when operating in the oscillator system in the first mode, configures the automatic gain control loop to provide the input voltage based on the difference and is configured to determine a second mode input voltage value based on monitoring the provided input voltage; and
- the controller, when operating in the oscillator system in the second mode, is configured to provide the second mode input voltage value as the input voltage.

2. The oscillator system of claim 1, wherein the controller is further configured to operate the oscillator system in the second mode upon a subsequent start up.

3. The oscillator system of claim 1, wherein, subsequent to operating the oscillator system in the second mode, the controller is configured operate the oscillator system in the first mode to update the second mode input voltage value.

4. The oscillator system of claim 1, wherein, when operating the oscillator system in the second mode, the controller is further configured to adjust the input voltage based on operating conditions.

5. The oscillator system of claim 1, wherein the automatic gain control loop comprises:
- a peak detector configured to receive the output waveform generated by the VCO and determine the indication of the amplitude of the output waveform;
- an analog circuit configured to receive the reference value and the indication of the amplitude of the output waveform and determine the difference between the reference value and the indication of the amplitude of the output waveform; and
- an amplifier configured to generate the input voltage based on the difference.

6. The oscillator system of claim 5, wherein:
- the source follower circuit is connected between the amplifier and the VCO; and
- the low pass filter is connected between the amplifier and the source follower circuit and configured to filter the input voltage generated by the amplifier before the input voltage is supplied to the source follower circuit.

7. The oscillator system of claim 1, wherein the automatic gain control loop comprises:
- a peak detector configured to receive the output waveform generated by the VCO and determine an indication of the amplitude of the output waveform;
- an analog to digital converter configured to receive the indication of the amplitude of the output waveform and provide a digital representation thereof, wherein the controller is configured to receive the reference value and the digital representation of the indication of the amplitude of the output waveform and determine a digital value for the difference; and
- a digital to analog converter configured to receive the digital value for the difference and generate therefrom the input voltage.

8. The oscillator system of claim 7, wherein:
- the source follower circuit is connected between the digital to analog converter circuit and the VCO; and
- the low pass filter is connected between the digital to analog converter and the source follower circuit and configured to filter the input voltage received from the digital to analog converter before the input voltage is supplied to the source follower circuit.

9. The oscillator system of claim 1, wherein the reference generator and automatic gain control loop are formed on an integrated circuit fabricated using CMOS technology, and a plurality of parasitic bipolar junction transistors are formed in the integrated circuit fabricated using CMOS technology, and wherein the automatic gain control loop comprises:
- a peak detector configured to receive the output waveform and determine an indication of the amplitude of the output waveform, wherein the peak detector is implemented using at least some of the plurality of parasitic bipolar junction transistors.

10. A method of controlling an amplitude of an output waveform of a voltage controlled oscillator (VCO), comprising:
- generating an output waveform by a VCO, the output waveform having an amplitude dependent on an input voltage;
- generating the input voltage by a closed loop having automatic gain control, including:
  - receiving a reference level;
  - determining a difference between an indication of the amplitude of the output waveform and the reference level;
  - generating the input voltage from the difference;
  - filtering the input voltage by a low pass filter;
  - supplying the filtered input voltage to the VCO by a source follower circuit; and
- while generating the input voltage by the closed loop, monitoring the input voltage to determine a closed loop input voltage value; and
- subsequently supplying the closed loop input voltage value as the input voltage.

11. The method of claim 10, further comprising:
- subsequent to supplying the closed loop input voltage value as the input voltage, shutting down operation of the VCO; and
- subsequently restarting the VCO to generate the output waveform and supplying the closed loop input voltage value as the input voltage.

12. The method of claim 10, further comprising:
- subsequently updating the closed loop input voltage value, the updating comprising:
  - generating the input voltage by the closed loop, and
  - while generating the input voltage by the closed loop, monitoring the input voltage to determine an updated closed loop input voltage value; and
- subsequently supplying the updated closed loop input voltage value as the input voltage.

13. The method of claim 10, further comprising:
- while supplying the closed loop input voltage value as the input voltage, adjusting the input voltage based on operating conditions.

14. The method of claim 10, wherein the difference is an analog voltage level, and generating the input voltage from the difference comprises:
- amplifying the analog voltage level.

15. The method of claim 10, wherein the difference is a digital value and generating the input voltage from the difference comprises:

converting the digital value to an analog voltage level.

16. A power supply for a voltage controlled oscillator (VCO), comprising:

a reference generator configured to provide a reference value; and a control loop, comprising:
- a peak detector configured to receive an output waveform of the VCO and determine an indication of an amplitude thereof; and
- an automatic gain control circuit configured to receive the reference value and the indication of the amplitude of the output waveform and generate an input voltage for the VCO based on a difference between the reference value and the indication of the output waveform, wherein the automatic gain control circuit comprises:
  - a source follower circuit connected to supply the input voltage to the VCO; and
  - a low pass filter configured to filter the input voltage before the input voltage is supplied to the source follower circuit; and a controller configured to operate the power supply in a first mode and in a second mode: the controller, when operating the power supply in the first mode, configures the control loop to provide the input voltage based on the difference between the reference value and the indication of the output waveform and is configured to monitor the input voltage to determine a second mode input voltage value; and the controller, when operating in the second mode, is configured to provide the second mode input voltage value as the input voltage.

17. The power supply of claim 16, wherein the control loop is formed on an integrated circuit fabricated using CMOS technology, and a plurality of parasitic bipolar junction transistors are formed in the integrated circuit fabricated using CMOS technology, and wherein the peak detector is implemented using at least some of the plurality of parasitic bipolar junction transistors.

18. The power supply of claim 16, wherein the automatic gain control circuit comprises:

an analog circuit configured to receive the reference value and the indication of the amplitude of the output waveform and determine the difference between the reference value and the indication of the amplitude of the output waveform; and an amplifier configured to generate the input voltage based on the difference when operating the power supply in the first mode.

19. The power supply of claim 16, wherein the automatic gain control circuit comprises:

an analog to digital converter configured to receive the indication of the amplitude of the output waveform and provide a digital representation thereof, wherein the controller is configured to receive the reference value and the digital representation of the indication of the amplitude of the output waveform and determine a digital value for the difference; and a digital to analog converter configured to receive the digital value for the difference and generate therefrom the input voltage.

* * * * *